(12) United States Patent
Leinikka et al.

(10) Patent No.: US 7,405,143 B2
(45) Date of Patent: Jul. 29, 2008

(54) METHOD FOR FABRICATING A SEED LAYER

(75) Inventors: Miika Leinikka, Vantaa (FI); Juhana J. T. Kostamo, Espoo (FI)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 10/810,415

(22) Filed: Mar. 25, 2004

(65) Prior Publication Data

US 2005/0212139 A1 Sep. 29, 2005

(51) Int. Cl.
*H01L 21/44* (2006.01)
*B05D 5/12* (2006.01)

(52) U.S. Cl. .................... 438/608; 438/648; 438/675; 438/680; 427/126.1; 427/126.3; 427/126.5

(58) Field of Classification Search .................. None
See application file for complete search history.

(56) References Cited

U.S. PATENT DOCUMENTS

| | | | |
|---|---|---|---|
| 3,708,728 A | 1/1973 | Sterling et al. |
| 4,058,430 A | 11/1977 | Suntola et al. |
| 4,565,747 A | 1/1986 | Nakae et al. |
| 4,935,661 A | 6/1990 | Heinecke et al. |
| 5,281,274 A | 1/1994 | Yoder |
| 5,306,666 A | 4/1994 | Izumi |
| 5,316,793 A | 5/1994 | Wallace |
| 5,342,652 A | 8/1994 | Foster et al. |
| 5,382,333 A | 1/1995 | Ando et al. |
| 5,438,028 A | 8/1995 | Weissman et al. |
| 5,595,784 A | 1/1997 | Kaim et al. |
| 5,603,771 A | 2/1997 | Seiberras et al. |
| 5,691,235 A | 11/1997 | Meikle et al. |
| 5,711,811 A | 1/1998 | Suntola et al. |
| 5,723,384 A | 3/1998 | Park et al. |
| 5,744,254 A | 4/1998 | Kampe et al. |
| 5,789,024 A | 8/1998 | Levy et al. |

(Continued)

FOREIGN PATENT DOCUMENTS

EP 0 387 403 A1 10/1989

(Continued)

OTHER PUBLICATIONS

"Kirk-Othmer Encyclopedia of Chemical Technology," 4th Edition, vol. 4, John Wiley & Sons, Inc. pp. 841-878, (1992).

(Continued)

*Primary Examiner*—Alonzo Chambliss
(74) *Attorney, Agent, or Firm*—Knobbe, Martens, Olson & Bear LLP

(57) ABSTRACT

The present invention produces a seed layer for the deposition of copper for metallizing integrated circuits. A diffusion barrier is deposited upon the wafer. In one embodiment of the invention, a metal oxide layer is then formed on the diffusion barrier. The oxidized metal is then reduced to a conductive lower oxidation state or to its elemental form. That metal is then used as the seed layer for the growth of copper. In another embodiment, the surface of the barrier layer is repeatedly oxidized and reduced in order to reduce incubation time for the growth of a seed layer. A ruthenium seed layer is then deposited over the treated barrier layer.

48 Claims, 7 Drawing Sheets

U.S. PATENT DOCUMENTS

| | | | |
|---|---|---|---|
| 5,915,004 | A | 6/1999 | Pabbati et al. |
| 5,916,365 | A | 6/1999 | Sherman |
| 5,946,598 | A | 8/1999 | Yeh |
| 5,964,943 | A | 10/1999 | Stein et al. |
| 5,972,430 | A | 10/1999 | DiMeo, Jr. et al. |
| 6,006,763 | A | 12/1999 | Mori et al. |
| 6,015,590 | A | 1/2000 | Suntola et al. |
| 6,087,257 | A | 7/2000 | Park et al. |
| 6,099,904 | A | 8/2000 | Mak et al. |
| 6,156,382 | A | 12/2000 | Rajagopalan et al. |
| 6,162,501 | A | 12/2000 | Kim |
| 6,203,613 | B1 | 3/2001 | Gates et al. |
| 6,206,967 | B1 | 3/2001 | Mak et al. |
| 6,284,646 | B1 | 9/2001 | Leem |
| 6,287,965 | B1 | 9/2001 | Kang et al. |
| 6,342,277 | B1 | 1/2002 | Sherman |
| 6,355,561 | B1 | 3/2002 | Sandhu et al. |
| 6,380,627 | B1 | 4/2002 | Weihs et al. |
| 6,416,577 | B1 | 7/2002 | Suntoloa et al. |
| 6,482,733 | B2 | 11/2002 | Raaijmakers et al. |
| 6,482,740 | B2 | 11/2002 | Soininen et al. |
| 6,534,395 | B2 | 3/2003 | Werkhoven et al. |
| 6,576,053 | B1 | 6/2003 | Kim et al. |
| 6,616,982 | B2 | 9/2003 | Merrill et al. |
| 6,652,924 | B2 | 11/2003 | Sherman |
| 6,753,249 | B1 * | 6/2004 | Chen et al. .................. 438/637 |
| 2003/0032281 | A1 | 2/2003 | Werkhoven et al. |
| 2003/0049931 | A1 | 3/2003 | Byun et al. |
| 2003/0104126 | A1 | 6/2003 | Fang et al. |
| 2003/0123216 | A1 | 7/2003 | Yoon et al. |
| 2003/0127043 | A1 | 7/2003 | Lu et al. |
| 2003/0153181 | A1 | 8/2003 | Yoon et al. |
| 2003/0157760 | A1 | 8/2003 | Xi et al. |
| 2003/0161952 | A1 | 8/2003 | Wang et al. |
| 2003/0165615 | A1 | 9/2003 | Aaltonen et al. |
| 2003/0181035 | A1 | 9/2003 | Yoon et al. |
| 2003/0194825 | A1 | 10/2003 | Law et al. |
| 2003/0203616 | A1 | 10/2003 | Chung et al. |
| 2005/0110147 | A1 * | 5/2005 | Wu et al. .................... 257/758 |

FOREIGN PATENT DOCUMENTS

| | | |
|---|---|---|
| EP | 0 394 054 A1 | 4/1990 |
| EP | 0 442 490 A1 | 8/1991 |
| EP | 0 573 033 A1 | 6/1993 |
| EP | 0 774 533 A1 | 10/1996 |
| EP | 0 899 779 A2 | 3/1999 |
| EP | 1 167 567 A1 | 2/2002 |
| JP | 6037041 | 2/1994 |
| JP | 6069157 | 3/1994 |
| JP | 7230957 | 8/1995 |
| JP | 8 264 530 A | 10/1996 |
| WO | WO 96/17107 | 6/1996 |
| WO | WO 96/18756 | 6/1996 |
| WO | WO 98/51838 | 11/1998 |
| WO | WO 00/01006 | 1/2000 |
| WO | WO 00/47404 | 2/2000 |
| WO | WO 00/47796 | 8/2000 |
| WO | WO 00/54320 | 9/2000 |
| WO | WO 01/53565 | 1/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/66832 A2 | 9/2001 |
| WO | WO 01/78123 | 10/2001 |
| WO | WO 01/88972 | 11/2001 |

OTHER PUBLICATIONS

Andriacacos et al., "Damascene copper electroplating for chip," *IBM Jour. Research and Dev.*, 42:567 (1998).

Bain et al., "Deposition of tungsten by plasma enhanced chemical vapour deposition," *J. Phys. IV France*, vol. 9, pp. 827-833 (1999).

Elers et al., "NbC15 as a precursor in atomic layer epitaxy," *Applied Surface Science*, 82/83:468-474 (1994).

Girolami, Gregory S., James A. Jensen, John E. Gozum, and Deborah M. Pollina, "Tailored Organometallics as Low-Temperature CVD Precursors to Thin Films," *Materials Research Society Symposium Proceedings*, vol. 121, pp. 429-438, (1988).

Helmut Tulhoff, Hermann C. Starck, and Werk Goslar, "Ullmann's Encyclopedia of Industrial Chemistry," 5th, Completely Revised Edition, vol. A5, pp. 61-77, (1986).

Hermann Jehn, Gudrun Bär, Erich Best, and Ernst Koch, "Gmelin Handbook of Inorganic and Organometallic Chemistry," 8th Edition, vol. A 5b, No. 54, pp. 131-154, (1993).

Hiltunen et al., "Nitrides of titanium, noibium, tantalum and molybdenum grown as thin films by the atomic layer epitaxy method," *Thin Solid Films*, 166:149-154 (1988).

Jeon, H., "A Study on the Characteristics of TiN Thin Film Deposited by Atomic Layer Chemical Vapor Deposition Method," *AVS 46th International Symposium*, Seattle, WA, abstract TF-MoP17 (1999).

Jeon, H., et al., "A Study on the Characteristics of TiN Thin Film Deposited by Atomic Layer Chemical Vapor Deposition Method," *J. Vac .Sci. Technol. A*, 18(4), 1595-1598 (2000).

Juppo et al., "Deposition of copper films by an alternate supply of CuCl and Zn," *J. Vac. Sci. Technol A*, vol. 15, No. 4, pp. 2330-2333, (Jul./Aug. 1997).

Klaus et al., "Atomic Layer Deposition of Tungsten Nitride Films Using Sequential Surface Reactions," *Journal of the Electrochemical Society*, vol. 147, No. 3, pp. 1175-1181, (2000).

Klaus et al.,"Atomic layer deposition of tungsten using sequential surface chemistry with a sacrificial stripping reaction," *Thin Solid Films*, vol. 360, pp. 145-153, (2000).

Klaus, J.W., et al., "Atomic layer deposition of tungsten and tungsten nitride using sequential surface reactions," *AVS 46th International Symposium*, Seattlhe, WA, abstract TF-TuM6 (1999).

Klaus, J.W., S.J. Ferro, and S.M. George, "Atomically controlled growth of tungsten and tungsten nitride using sequential surface reactions," *Applied Surface Science*, vols. 162-163, pp. 479-491, (2000).

Lai, Ken K. and H. Henry Lamb, "Precursors for Organometallic Chemical Vapor Deposition of Tungsten Carbide Films," *Chem. Mater.*, vol. 7, pp. 2284-2292, (1995).

Leskelä "ALD precursor chemistry: Evolution and future challenges," *Jour. Phys. IV France 9*, pp. 837-852 (1999).

Ludviksson et al., "Low-Temperature Thermal CDV of Ti-Al Metal. Films Using a Strong Reducing Agent," *Chem. Vap. Deposition*, vol. 4, No. 4, pp. 129-132, (1998).

Martensson et al., "Atomic Layer Epitaxy of Copper and Tantalum," *Chemical Vapor Deposition*, vol. 3, No. 1, pp. 45-50, (1997).

Martensson et al., "CU(THD)$_2$ As Copper Source in Atomic Layer Epitaxy," *Electrochemical Society Proceedings*, vol. 97-25, pp. 1529-1536, (1997).

Martensson, "Use of atomic layer epitaxy for fabrication of Si/TiN/Cu structures," *J. Vac. Sci. Technol. B*, vol. 17, No. 5, pp. 2122-2128, (Sep./Oct. 1999).

Min, Jae-Sik ,Young Woong Son, Won-Gu Kang, Soung-Soon Chun, and Sang-Won Kang, "Atomic Layer Deposition of TiN Films by Alternate Supply of Tetrakis (ethylmethylamino)-Titanium and Ammonia," *Jpn. J. Appl. Phys.*, vol. 37, pp. 4999-5004, (1998).

Min,Jae-Sik, Young-Woong Son, Won-Gu Kang, and Sang-Won Kang, "Atomic Layer Deposition of TiN Thin Films by Sequential Introduction of Ti Precursor and HN$_3$," *Mat. Res. Soc. Symp. Proc.*, vol. 514, pp. 337-342, (1998).

Nakajima, Tsuyoshi and Toru Shirasaki, "Chemical Vapor Deposition of Tungsten Carbide, Molybdenum Carbide Nitride, and Molybdenum Nitride Films," *J. Electrochem. Soc.*, vol. 144, No. 6, pp. 2096-2100, (Jun. 1997).

Polyakov et al., "Growth of GaBN Ternary Soloutions by Organometallic Vapor Phase Epitaxy," *Journal of Electronic Materials*, Vo. 26, No. 3, pp. 237-242, (1997).

Ritala et al., "Atomic layer epitaxy growth of TiN thin films," *J. Electrochem. Soc.*, 142(8):2731-2737 (1995).

Ritala, Mikko, Markku Leskelä, Eero Rauhala, and Janne Jokinen, "Atomic Layer Epitaxy Growth of TiN Thin Films from $TiL_4$ and $NH_3$," *J. Electrochem. Soc.*, vol. 145, No. 8, pp. 2914-2920, (Aug. 1998).

Ritala et al., "Effects of intermediate zinc pulses on properties of TiN and NbN films deposited by atomic layer epitaxy," *Appl. Surf. Sci.*, 120:199-212 (1997).

Ritala et al., "Perfectly conformal TiN and $Al_2O_3$ films deposited by atomic layer deposition," *Chem. Vapor Deposition*, 5:7-9 (1999).

Ryu et al., "Barriers for copper interconnections," *Solid State Technology*, April, 53 (1999).

Sherman et al., "Plasma enhanced atomic layer deposition of Ta for diffusion barrier applications," AVS 46th International Symposium, Paper TF-TuM5 (abstract), (Oct. 26, 1999), Seattle, WA.

Yang et al., "Atomic Layer Deposition of Tungsten Film from WF6/B2H6: Nucleation Layer for Advanced Semiconductor Devices," Advanced Metallization Conference 2001 (AMC 2001), Conference Proceedings ULSI XVII@2002 Materials Research Society, pp. 655-660.

* cited by examiner

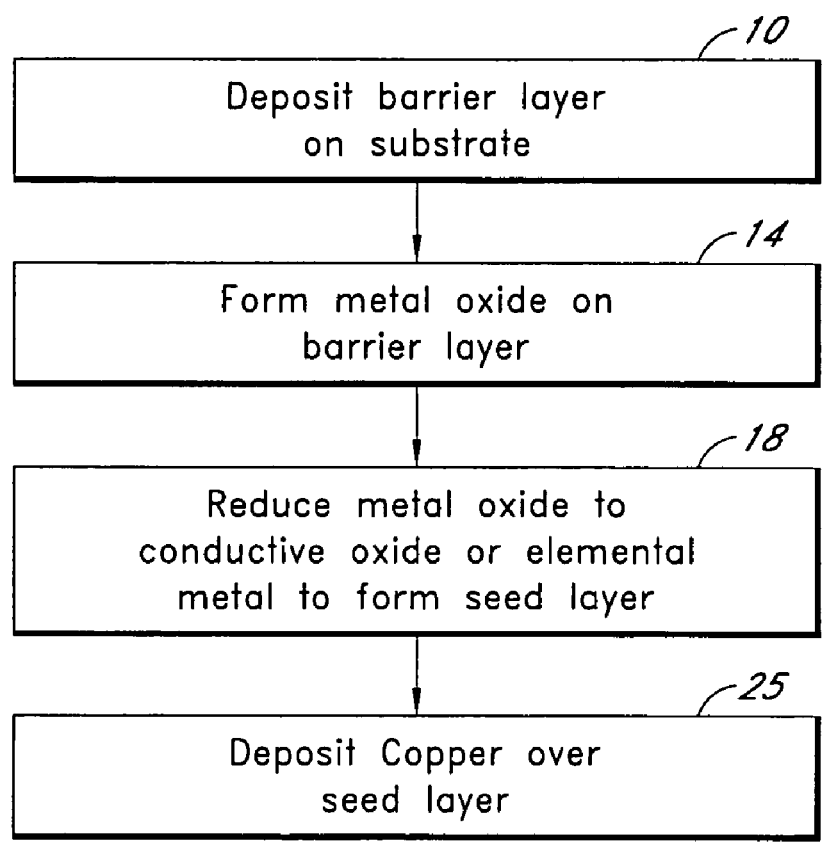

METHOD FOR FABRICATING A SEED LAYER

FIELD OF THE INVENTION

This invention relates to integrated circuit metallization processes, and particularly to the formation of a seed layer that is utilized for deposition of bulk copper.

BACKGROUND OF THE INVENTION

Metallization is the process that forms the interconnections of the components on an integrated circuit (IC). This can be accomplished by the deposition of a thin layer of a metal over the entire surface of the IC and then etched in a desired pattern. Until recently, the metal has commonly been aluminum, because dry etch processes are available for aluminum. Since the development of chemical mechanical polishing (CMP) techniques for the more conductive copper, damascene processing is rapidly gaining in acceptance. In damascene processes, a thick dielectric layer is patterned with trenches and/or vias, metal is blanket deposited over the substrate and into the openings, and excess metal is polished away from the top surfaces of the dielectric. This leaves metal inlaid within the trenches and/or vias. In order for the metal, typically copper, to be properly laid there must be an appropriate surface for the copper to adhere to. Copper can be deposited by chemical vapor deposition (CVD) or plating, but in either case a suitable seed layer is typically formed lining the openings prior to bulk copper deposition.

Because of its high electrical conductivity and good electromigration properties, copper, rather than aluminum, is preferred in modern integrated circuits. Ohmic losses of the conductors are decreased because copper has a much higher conductivity than aluminum. The lower resistance and the associated ohmic losses are beneficial in photovoltaic applications in addition to analog and digital microcircuits and microprocessors. Copper-metallized microcircuits can accommodate higher currents because of copper's higher resistance to electromigration. Additionally, copper's properties allow the use of narrower and thinner conductors and interconnections. Furthermore, since tighter packing density can be obtained with copper, fewer metallization levels are typically needed for equivalent circuit designs using copper interconnects and, thus, the manufacturing costs can be lower than with aluminum.

However, copper's benefits are also balanced by some problems. A major problem associated with using copper is that it diffuses readily in common insulating materials. Therefore, great care has to be taken in order to prevent direct contact between copper and typical silicon oxide-based insulating layers. If this were to occur in an IC, it would cause short circuits. In order to prevent such diffusion, a barrier layer is generally introduced between the insulator and copper. This barrier layer, called a diffusion barrier, is deposited over the insulator surface before copper deposition, or over copper lines prior to insulator deposition. Some examples of relatively conductive barrier layers include tungsten, molybdenum, and titanium compounds, such as nitrides and carbides.

The atomic layer deposition (ALD) method of depositing thin films, such as diffusion barriers, has several attractive features including excellent step coverage, even on large areas, and a dense and pinhole-free structure. Therefore, it is also of great interest to apply ALD to the deposition of metallization layers of advanced integrated circuits (ICs), where the continuously increasing packing density and trench/via aspect ratios set higher demands upon the metallization layers. Applications where high quality metallization is particularly needed are dual damascene structures, gates in transistors and capacitor electrodes in ICs. However, due to the fact that ALD is based on sequential self-saturating surface reactions of source chemical compounds, depositing high quality elemental metal thin films by ALD is very difficult.

Metal oxide thin films produced by ALD, on the other hand, can be very uniform, have excellent adhesion and thus can be firmly bonded to the substrate surface. ALD metal oxide thin films can be used to make conductive thin films through oxidation state reduction after deposition of a metal oxide thin film. For example, Soininen et al., used an ALD deposited metal oxide thin film in order to produce a conductive thin film. (U.S. Pat. No. 6,482,740). After the ALD metal oxide thin film was produced, it was reduced by using organic compounds with at least one of the following functional groups: —OH, CHO, and —COOH, thus producing a metal thin film layer. Films of this process include both metal and conductive metal oxide films from various elements, including cobalt, copper, gold, nickel, osmium, platinum, rhenium, ruthenium, and silver.

One of the most advanced IC structures is the dual damascene structure over a semiconductor substrate with transistors (including source, gate and drain). Several electrically conducting layers are needed in the structure. The first metallization level is conventionally fabricated with tungsten plugs and aluminum interconnects to prevent the contamination of the gate with copper. The remainder of the metallization levels are preferably made of copper.

Metallization of the trenches and vias can be attained by copper electroplating. Alternatives are electroless plating, physical vapor deposition (PVD), and CVD. A seed layer, usually deposited by CVD or PVD, is typically needed for electroplating processes. In the electroplating process the substrate having an electrically conductive seed layer is immersed in a metal compound solution. The electrically conductive surface of the substrate and an opposing electrode are connected to an external DC power supply. A current passes through the substrate surface into the solution and metal is deposited on the substrate. The seed layer has high conductivity and it acts as a conduction and nucleation layer for the electroplating process. A first seed layer can also act as a nucleation layer for the CVD process that forms a subsequent electroplating seed layer. The electroplating seed layer carries current from the edge of the wafer to the center of the wafer and from the top surface of the wafer into the bottom of vias and trenches, so it must be conductive. A uniform and continuous seed layer is desirable to produce uniform electroplated copper. The quantity of the deposited metal is directly proportional to the local current density on the substrate.

It has been complicated to form a sufficiently uniform copper seed layer on a diffusion barrier in high aspect ratio trenches and vias. For example, in the process of U.S. Pat. No. 6,482,740, the process window of ALD-grown copper oxide is rather narrow. In that process, copper oxide is reduced into elemental copper metal in a subsequent process step. Direct growth of elemental copper using ALD chemistry is also rather complicated, and it can contaminate the ALD reactor chamber. Other materials have been tried in place of a copper seed layer. Copper will grow evenly on these non-copper seed layers, but there are drawbacks to these chemicals as well. For example, ruthenium makes an excellent seed layer. Additionally, it will bond well to the surface of a barrier layer such as tungsten nitride carbide ($WN_xC_y$, wherein x and y denote a range of chemical compositions including non-stoichiometric compounds). However, the growth of a ruthenium seed layer can itself be a very time consuming process, as the incubation or nucleation period of the ruthenium is quite long.

It is accordingly an objective of the present invention to avoid these and other disadvantages and to facilitate the process of metallizing dual damascene structures. There is a need for better and more efficient seed layers for the deposition of metals for the purpose of metallizing ICs.

BRIEF SUMMARY OF THE INVENTION

According to one aspect of the invention, a method for metallizing an integrated circuit is provided. The method comprises depositing a diffusion barrier on a substrate. A top layer of the diffusion barrier is oxidized to form a metal oxide layer. The oxidation state of the metal oxide layer is preferably reduced in order to form a seed layer. A conductor is then deposited directly over the seed layer.

In a preferred embodiment, the diffusion barrier layer is tungsten nitride carbide or molybdenum nitride carbide.

According to another aspect, a method for metallizing an integrated circuit comprises forming a diffusion barrier layer on a substrate and performing a preparation process on the substrate to form a nucleation layer. Ruthenium is then deposited of the nucleation layer to form a second seed layer. Copper is then deposited over the second seed layer.

Preferably, the preparation process is repeated before depositing a conductive layer to form a seed layer. In a preferred embodiment, the preparation process comprises exposing the substrate to pulses of oxygen and hydrogen and the conductor is ruthenium.

In another aspect, another method of metallizing an integrated circuit comprises forming a tungsten nitride carbide diffusion barrier on a substrate. A tungsten oxide layer is then formed over the diffusion barrier. The tungsten oxide layer is reduced to form a first seed layer before depositing a copper layer over the first seed layer.

In another aspect of the invention, a metallization structure comprises a diffusion barrier including a metal and deposited by atomic layer deposition, a nucleation layer formed from the metal in the diffusion barrier layer, and a ruthenium seed layer deposited by ALD over the nucleation layer.

In another aspect, a metallization structure in an integrated circuit comprises a diffusion barrier, a first seed layer directly over the diffusion barrier formed from the same metal as the diffusion barrier, and a copper layer over the first seed layer.

In a preferred embodiment of the above aspect of the invention, there is a second seed layer between the first seed layer and the copper layer. Preferably this second seed layer is ruthenium.

BRIEF DESCRIPTION OF THE DRAWINGS

These and other aspects of the invention will be better understood from the Detailed Description of the Preferred Embodiments and from the appended drawings, which are meant to illustrate and not to limit the invention, and wherein:

FIG. 4 is a flow chart of a process for metallizing a circuit with a preferred embodiment of the invention.

DETAILED DESCRIPTION OF THE PREFERRED EMBODIMENTS

In the illustrated embodiments, the metallization process is simplified because the direct or indirect deposition of a copper-containing seed layer can be eliminated from the process steps. Additionally, copper contamination of chemical vapor deposition (CVD) and atomic layer deposition (ALD) reactors is avoided.

According to an embodiment of the present invention as shown in FIG. 4, a diffusion barrier is deposited 10 on a substrate (e.g., semiconductor wafer). Preferably, a barrier layer such as tungsten nitride carbide or molybdenum nitride carbide can be deposited by ALD. A metal oxide is then formed 14 on the diffusion barrier layer. The metal oxide is preferably formed by oxidizing the surface of the diffusion barrier. The metal oxide is reduced 18 to a more conductive state in order to form a seed layer. This more conductive state can be a metal oxide with a lower oxidation state or an elemental metal. Copper is then deposited 25 over the seed layer. The elemental metal or conductive metal oxide serves as the seed layer when copper is deposited. Through this process, one of the critical steps in the metallization of an integrated circuit, the deposition of a copper-containing seed layer, can be eliminated.

According to another embodiment of the invention, a second seed layer (ruthenium in the illustrated embodiment) is deposited after a preparatory process, and the preparatory process preferably comprises the repeated process of oxidization and reduction of the barrier layer to form a first seed layer. The first seed layer shortens the incubation time of the ruthenium ALD deposition. By decreasing the incubation time of a second seed layer, the total process time is reduced. In the illustrated embodiment, the preparatory process for forming the first seed layer comprises exposing a wafer that is coated with a barrier layer to alternating pulses of oxygen and hydrogen plasma. The second seed layer is preferably formed by depositing ruthenium by ALD after preparing a barrier-layer coated substrate. A process for depositing elemental ruthenium by ALD is disclosed in U.S. patent application Ser. No.

10/066,315, filed Jan. 29, 2002, and published as U.S. 2003/0165615 on Sep. 4, 2003, disclosure of which is herein incorporated by reference. The ruthenium then serves as a seed layer for any copper that is to be deposited on the substrate.

The formation of seed layers and the subsequent metallization is particularly important in the context of a dual damascene structure. ALD can form high quality and very conformal thin films in damascenes, and the embodiments described can be applied to the damascene context.

The Formation of a Barrier Layer

Figure 1A:
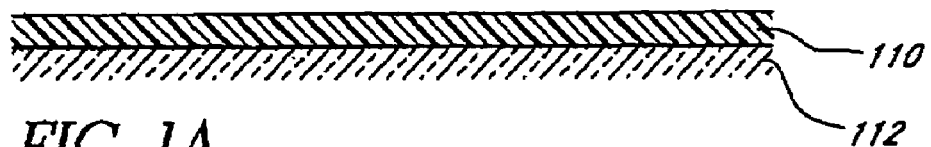
FIG. 1a is a schematic, cross-sectional side view of a substrate with a diffusion barrier on top in accordance with a starting step for a preferred embodiment of the present invention.

As shown in FIG. 1a, a diffusion barrier 110 is deposited upon a substrate 112, preferably by atomic layer deposition (ALD). ALD is preferred for the conformity and quality of the thin films it produces. Preferably, the diffusion barrier is a metal nitride, such as tantalum nitride, e.g. TaN or $Ta_3N_5$, or a metal carbide, such as tungsten carbide, e.g $W_2C$ or WC, or their mixtures or nanolaminates, more preferably a metal nitride carbide. In two exemplary embodiments, the diffusion barrier is either tungsten nitride carbide ($WN_xC_y$) or molybdenum nitride carbide ($MoN_xC_y$). A process of forming thin films, such as the diffusion barrier, is disclosed in U.S. patent application Ser. No. 10/242,368, filed Sep. 12, 2002, and published as 2003/0082296 on May 1, 2003, and Ser. No. 09/644,416, filed Aug. 23, 2000, disclosures of which are herein incorporated by reference. The substrate could be a silicon wafer, or any other substrate.

The barrier layer 110 is preferably produced by an ALD process. ALD produces thin films with excellent step coverage. Step coverage is the ratio of thickness of the film at the bottom of the step to the thickness of the film at the upper surfaces of the step. Good step coverage reduces electromigration and high-resistance pathways. ALD generally produces films with step coverage of greater than 95%. A typical ALD process comprises the following steps:

1. placing a substrate into a reaction chamber;
2. feeding into the reaction chamber and contacting the substrate with a pulse of at least one first source chemical, preferably in the vapor phase, under conditions such that no more than a molecular monolayer of the first source chemical adsorbs on the substrate;
3. removing gases from the chamber;
4. feeding into the reaction chamber and contacting the substrate with a pulse of at least one second source chemical, preferably in the vapor phase, comprising a compound capable of reacting with the adsorbed species of the first source chemical on the substrate;
5. removing gases from the chamber; and
6. repeating steps 2 through 5 until a desired thickness of the growing thin film is reached.

According to the ALD principles, the previous reactant (i.e. previously pulsed source chemical) and the gaseous by-products of the surface reaction are removed from the reaction chamber before the next pulse of a reactant is introduced into the reaction chamber. The reactants and the by-products can be removed from the reaction chamber by pumping down the chamber to a higher vacuum by a vacuum pump, by purging the chamber with an inert gas pulse, or by a combination of the two. Additional pulse and removal steps can be added to each cycle.

A method of forming metal nitride carbide thin films, such as $WN_xC_y$ or $MoN_xC_y$, is disclosed in the '368 application incorporated above. For the deposition of $WN_xC_y$, the substrate temperature is preferably selected from a range of 275-350° C., more preferably from a range of 300-325° C. The W, N and C source chemicals for the deposition of $WN_xC_y$ are preferably tungsten hexafluoride ($WF_6$), ammonia ($NH_3$), and triethylboron (TEB), respectively. For $MoN_xC_y$ the sources for Mo, N, C are preferably molybdenum hexafluoride ($MoF_6$), ammonia ($NH_3$), and triethylboron (TEB), respectively. The temperature values may also differ slightly. However, skilled artisans will appreciate that different source chemicals and temperature ranges can be used.

Oxidation of the Surface of the Barrier Layer

Figure 1B:
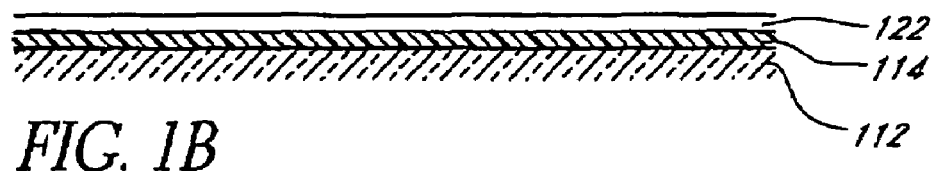
FIG. 1b is a schematic, cross-sectional side view of the substrate of FIG. 1a after a layer of metal oxide has been formed over the diffusion barrier.

In a preferred embodiment, the surface of the diffusion barrier 110 (FIG. 1a), preferably $WN_xC_y$ or $MoN_xC_y$, is next oxidized with an oxygen source chemical in order to create a metal oxide 122 (FIG. 1b), comprising tungsten oxide or molybdenum oxide for the exemplary embodiments. In some preferred embodiments this oxygen source could be air, diatomic oxygen ($O_2$), ozone ($O_3$), oxygen radicals ($O^*$), or hydrogen peroxide ($H_2O_2$). The oxidation can be performed as the result of being exposed to air in a clean room or other environment, but is preferably actively performed thermally and/or by exposure to radicals. The oxidation leaves a thinner diffusion barrier 114.

Figure 5:
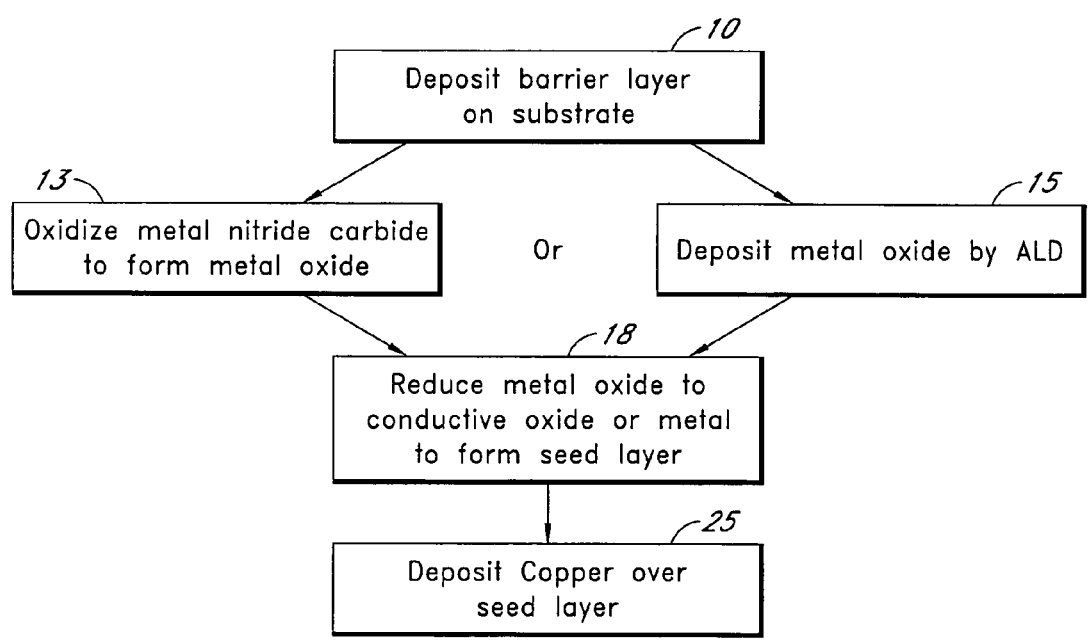
FIG. 5 is a flow chart of a process for metallizing a circuit with another preferred embodiment of the invention.

Another embodiment involves replacing the oxidation step 13 (FIG. 5) with the deposition 15 (FIG. 5) of the metal oxide 122 (FIG. 1b), preferably tungsten oxide or molybdenum oxide, by ALD on the diffusion barrier, which advantageously produces high quality, conformal films. Methods such as CVD can also be used to form a metal oxide film. However, the skilled artisan will recognize that other methods of depositing a metal oxide thin film may be used in the methods of the invention. The metal oxide 122 preferably includes a metal in common with the underlying barrier layer 114.

Reduction of the Oxide into a Metallic Seed Layer

Figure 1C:
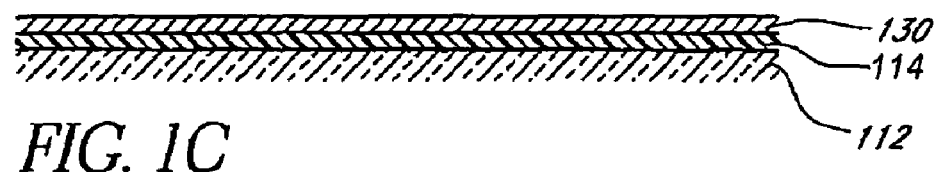
FIG. 1c is a schematic, cross-sectional side view of the substrate of FIG. 1b after the metal oxide has been reduced to a conductive metal oxide or an elemental metal.

With reference to FIG. 1c, the metal oxide 122, preferably tungsten oxide or molybdenum oxide, is reduced into a conductive state to form a first seed layer 130. In preferred embodiments, the reduction is performed with hydrogen, hydrogen plasma, or carbon monoxide into a conductive metal oxide or elemental metal layer 130 that can be used as a seed layer. This can be seen in FIG. 1c. Surprisingly, reduction of tungsten oxide by thermal hydrogen can be accomplished at temperatures as low as 130° C. Of course, when the temperature is higher, the process time is shorter. For even shorter process time, in situ or remote hydrogen plasma can be used.

In another preferred embodiment, the metal oxide is electrochemically reduced to metal. A current is applied to the metal oxide in order to reduce it to the elemental metal form. In this embodiment, the elemental metal, (e.g. tungsten or molybdenum) is then used as a seed layer for the deposition of copper for the vias and trenches.

Another embodiment is the reduction using a gaseous organic compound that contains one of the members of the following group: alcohol (—OH), aldehyde (—CHO), and carboxylic acid (—COOH). Reduction processes employing these organic reducing agents are described in U.S. Pat. No. 6,482,740, issued to Soininen, et al., and incorporated by reference herein. In a preferred embodiment using one of the above-named organic compounds, the metal oxide is reduced from a high oxidation state (such as $WO_3$) to a conductive low oxidation state (such as $WO_2$). The conductive low oxidation state metal is preferably used as a seed layer or further reduced using other reduction methods.

Second Seed Layer Process

Figure 6:
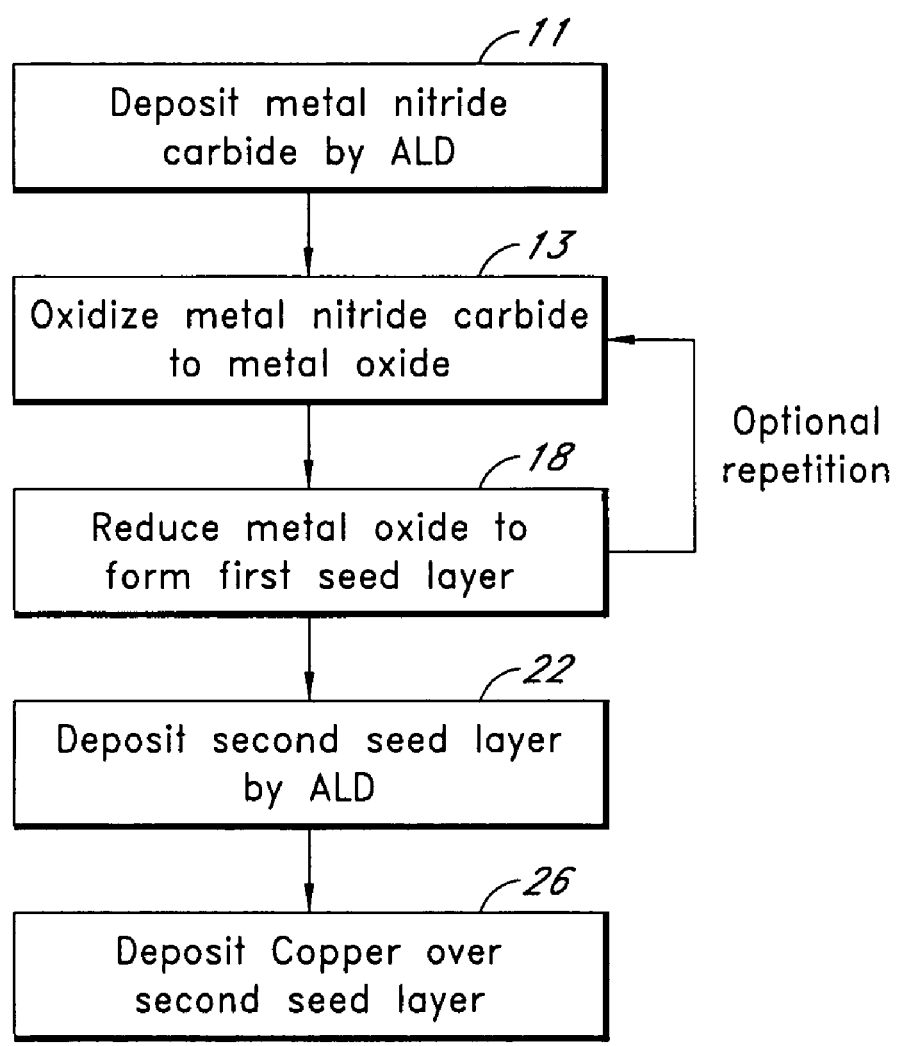
FIG. 6 is a flow chart of a process for metallizing a circuit with another preferred embodiment of the invention.

As seen in FIGS. 2a-2d, another embodiment involves a second seed layer being deposited by an ALD process. Ruthenium, for example, can serve as a seed layer for subsequent CVD deposition of copper. However, the deposition of ruthenium via the ALD process is slow because of poor nucleation to the surface of layers such as $WN_xC_y$. To speed up the nucleation, the metal or metal oxide seed layer of the above process is preferably used as a nucleation layer for the ALD deposition of ruthenium. In order to increase the nucleation, additional cycles of oxidation and reduction are used in this preparation process. This process is outlined in the flow chart of FIG. 6.

There are different forms of the preparation process for producing the first seed layer as a nucleation layer for depositing the second seed layer. Preferably the preparation process includes the combination of exposing the substrate to alternating pulses of oxygen and either in situ or remote hydrogen plasma or thermal hydrogen $H_2$, more preferably in situ plasma. Thus, the process of forming the metal or conductive metal oxide layer to be used as a nucleation layer above can be the first of these cycles.

In one embodiment, the substrate 212, which has been coated by a diffusion barrier 210 is repeatedly exposed to short pulses of oxygen and alternated with either in situ or remote hydrogen plasma. This process is then repeated n times. This forms a nucleation layer 232, and leaves a thinner original diffusion barrier layer 214. Here, n can range from 1 to 100. In some embodiments the formed nucleation layer 232 is dense enough to act both as a nucleation layer and as a modified diffusion barrier layer resting on the original diffusion barrier layer 214. Generally, more cycles of this process leads to better nucleation and consequently, a lower sheet resistance and a thicker seed layer. In one embodiment, n is preferably between about 10 and 50, more preferably between about 20 and 40, and more preferably about 30. This allows for a balance between time in the preparation process and for time in the incubation time of the ruthenium seed layer. Each pulse can last less than a second or up to several minutes. The pulses of oxygen and hydrogen preferably last between about one second and one minute, more preferably between about 5 and 40 seconds, and most preferably between about 10 and 30 seconds. Regarding the deposition of ruthenium metal, reference is made to the U.S. Patent Application publication no. 2003/0165615, incorporated by reference herein above. Typical pulse times for the ruthenium and oxygen source chemicals are in the range of 0.5-1.5 s and 0.5-1.0 s, respectively. Purge periods between the reactant pulses are typically in the range of 0.5-2.0 s. The oxygen source flow rate is scaled according to the size of the substrates to be coated, and the $O_2$ flow rate can be selected e.g. from the range of about 5-100 std. cm$^3$/min (sccm).

Figure 2A:
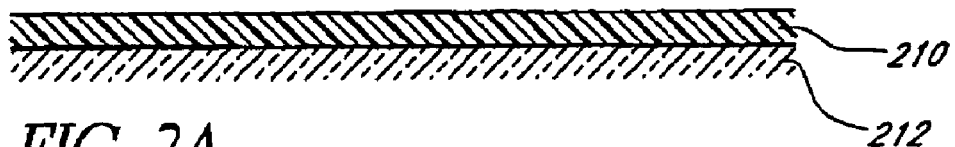
FIG. 2a is a schematic, cross-sectional side view of a substrate with a diffusion barrier on top in accordance with a starting step for another preferred embodiment of the present invention.
Figure 2B:
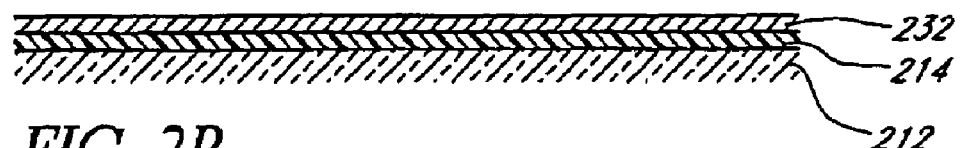
FIG. 2b is a schematic, cross-sectional side view of the substrate of FIG. 2a after a nucleation layer has been formed over the barrier layer, similar to the seed layer of FIG. 1c.
Figure 2C:
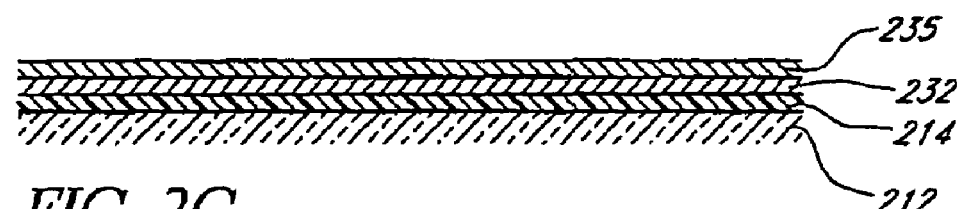
FIG. 2c is a schematic, cross-sectional side view of the substrate of FIG. 2b after a ruthenium seed layer has been deposited over the nucleation layer.

In another embodiment, the preparation process includes exposing to a pulse of a ruthenium source chemical at the beginning of each cycle of the preparation process. The chamber is then purged, and the wafer is then exposed to oxygen. After another purge, the wafer is exposed to hydrogen plasma, either in situ or remote. This process is repeated n times, where n can range from 1 to 100. As seen in FIG. 2c, ruthenium is further deposited (without the oxidation and reduction pulses) by ALD to form a seed layer 235 after the preparation process is complete.

Deposition of Copper

Figure 1D:
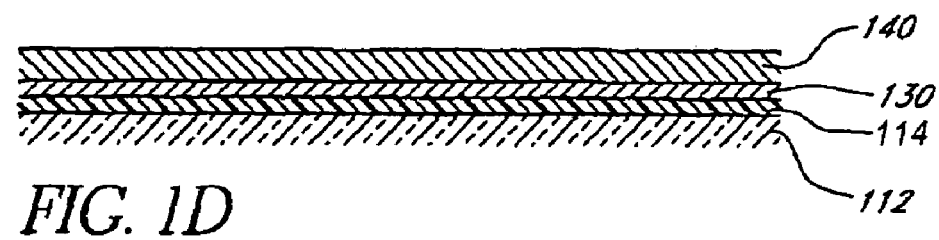
FIG. 1d is a schematic, cross-sectional side view of the substrate of FIG. 1c after copper has been deposited.
Figure 2D:
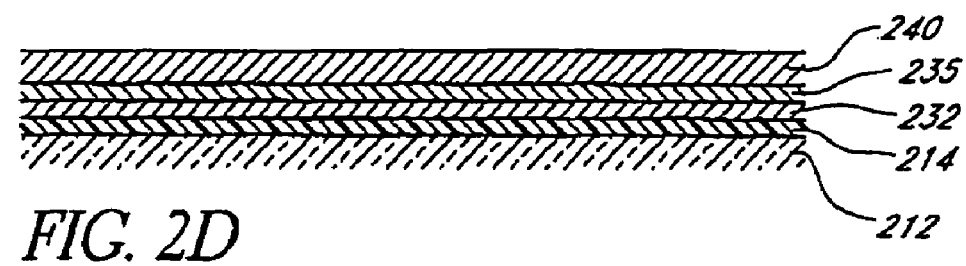
FIG. 2d is a schematic, cross-sectional side view of the substrate of FIG. 2c after copper has been deposited.

As shown in FIG. 1d and FIG. 2d, copper 140, 240 is deposited on a seed layer in order to complete the metallization of the circuit, preferably by electrochemical deposition. Alternatives are electroless plating, physical vapor deposition (PVD) and chemical vapor deposition (CVD). By using a conductive seed layer, such as a tungsten, molybdenum, or ruthenium, electroplating is possible and efficient. Copper can also be deposited on the seed layer by CVD, PVD, and electroless plating methods. In any of these copper deposition processes, the trenches and vias are filled with bulk copper.

Preferably, the direct or indirect deposition of a copper-containing seed layer is avoided. By avoiding this step, the possibility of copper contamination of CVD and ALD reactors is significantly decreased. As described in U.S. Pat. No. 6,482,740, which was previously incorporated by reference, copper oxide deposition is a slow process; oxidation and reduction as described above can be more efficient and economical. Additionally, time is saved in the processing of a wafer by using the oxidation and reduction processes, as opposed to a separate deposition step, and the layer adhesion is seen to greatly improve.

Figure 3A:
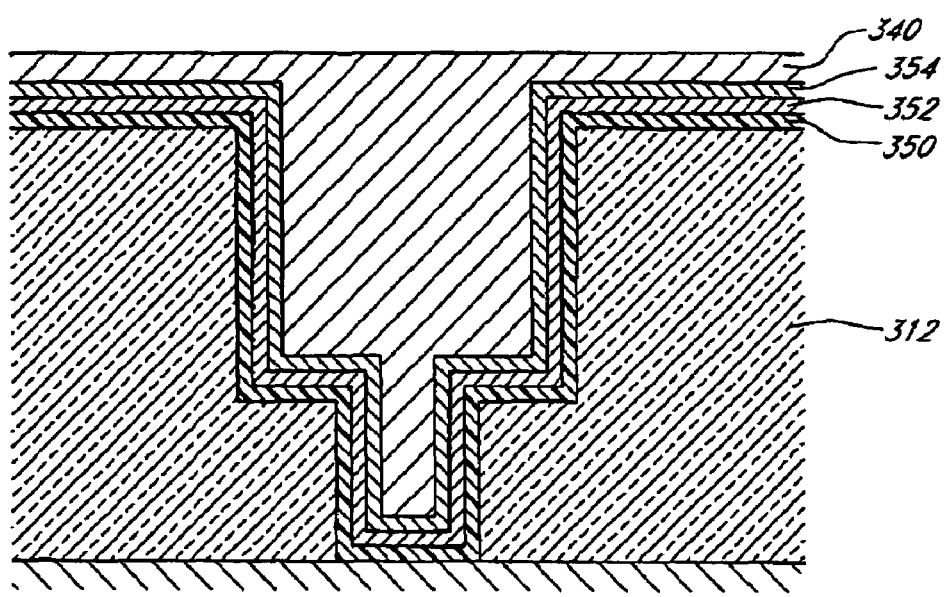
FIG. 3a is a schematic, cross-sectional side view of a dual damascene structure with a diffusion barrier, first seed layer, second seed layer, and copper.

As seen in FIG. 3a, the first seed layer 352 can be used as described above to be a nucleation layer for a ruthenium second seed layer 354. Copper filler 340 can then be deposited on the second seed layer 354. In some other embodiments copper filler 340 can also be deposited directly on the first seed layer 352, which is formed from the underlying diffusion barrier 350. Copper layers can be seen in FIGS. 1d and 2d, as well as in the context of a dual damascene structure in FIGS. 3a and 3b.

After the copper has been deposited, there will be several layers on the substrate. First, it will have a diffusion barrier layer 350, preferably $WN_xC_y$ or $MoN_xC_y$. It will then have a first seed layer 352 of a metal or a conductive metal oxide. If the ruthenium seed layer 354 and the associated preparation process are used, that first seed layer 352 will be used as a nucleation layer for the second seed layer 354 of ruthenium. The ruthenium seed layer 354 will have the features and benefits of an ALD-deposited thin film. Finally, a layer of copper filler 340 will be on top of these other layers.

Structure

In dual damascene structures, metallization is particularly important. The damascene structure can be seen in FIG. 3a with copper deposited into the damascene openings. A diffusion barrier layer 350 lines the walls of the trench, preferably $WN_xC_y$ or $MoN_xC_y$. A first seed layer 352 directly overlies the diffusion barrier 350. As discussed earlier, this first seed layer 352 is preferably made from the same metal as the diffusion barrier 350. The next layer is an optional second seed layer 354 made using the preferred embodiment discussed above. Finally, copper filler 340 fills the trench.

Figure 3B:
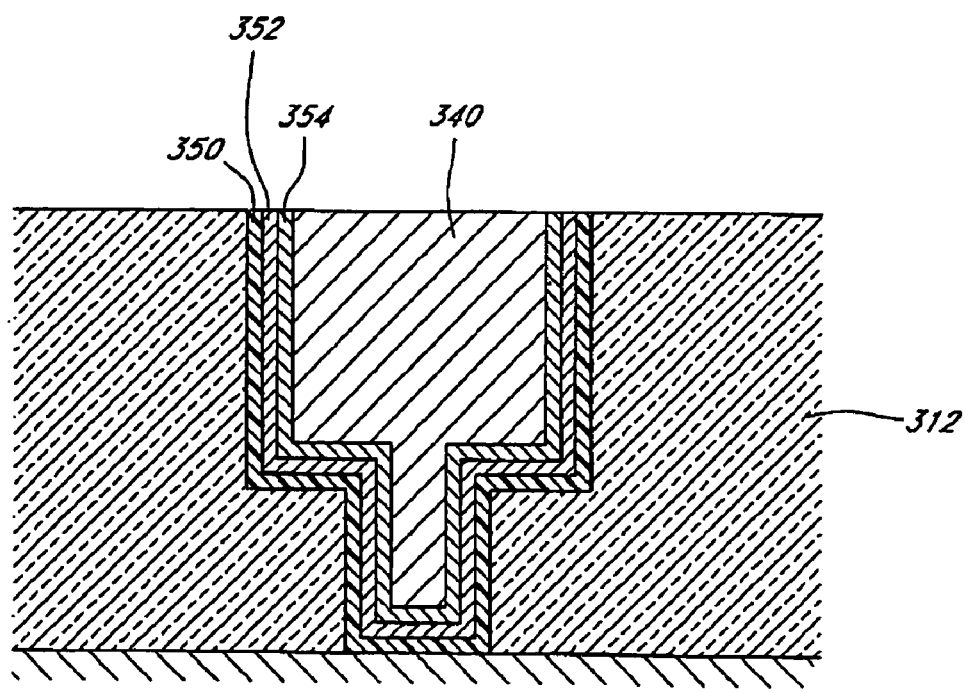
FIG. 3b is a schematic, cross-sectional side view of the dual damascene structure of FIG. 3a after a chemical mechanical planarization process.

FIG. 3b is a drawing of the structure after a chemical mechanical polishing (CMP) or other planarization process. It is also possible to deposit a CMP stop layer on the top surface of the insulator 312 before etching the trenches and vias. A CMP stop layer (not pictured) can be any material with a smaller etch rate than the insulator 312, such as SiC. In another preferred embodiment, the diffusion barriers described herein are used as a CMP stop layer. The preferred materials for the diffusion barrier, $WN_xC_y$ and $MoN_xC_y$, are also used as etch stops in many applications. Using the diffusion barrier as the CMP stop layer saves a step over depositing a separate etch stop layer.

Example: Deposition of Copper Upon Tungsten Seed Layer

A 20 nm thermal silicon oxide wafer was coated with 10 nm of $WN_xC_y$ and transported to another facility. During the process of transportation between the factories, 1.9 nm (19 Å) of the barrier layer $WN_xC_y$ was oxidized. The surface of this wafer was then reduced with in situ $H_2$ plasma using a power of 1500 W at 250° C. for 30 seconds in an Eagle™ 10 reactor, available from ASM Japan K.K. of Tokyo, Japan. The wafer was again transported to another factory for the deposition of copper. About 50 nm of copper was deposited by using a metal organic chemical vapor deposition (MOCVD) Superfill deposition. After transportation back to the original facility, the wafer was tested by forming a 11×11 scratch grid with diamond-tipped pen and using the standard Scotch tape tests. This test revealed that the film did not delaminate, even after thermal cycling of 3 cycles of 1 minute at 400° C., with 5 minutes of cooling in between.

Thus, it could be seen that no copper seed layer is needed for CVD copper deposition if the $WN_xC_y$ surface is first oxidized by air or some other oxidant and then reduced into tungsten by a process such as using in situ hydrogen plasma. A similar method can be used in making seedless ECD copper deposition on a conductive tungsten surface. However, the seed layer should be thicker for ECD deposition, preferably by actively (thermally or by plasma) oxidizing the film prior to reduction.

Although the foregoing invention has been described in terms of certain preferred embodiments, other embodiments will be apparent to those of ordinary skill in the art. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A method for metallizing an integrated circuit, the method comprising
   depositing a diffusion barrier on a substrate;
   oxidizing a top layer of the diffusion barrier to form a metal oxide layer, wherein the oxidizing forms the metal oxide layer from metal in the diffusion barrier;
   reducing the oxidation state of the metal oxide layer formed by oxidizing the top layer of the diffusion barrier to form a first seed layer; and
   depositing a conductor directly on the first seed layer.

2. The method of claim 1, wherein depositing a diffusion barrier layer comprises an atomic layer deposition process.

3. The method of claim 1, wherein depositing a diffusion barrier comprises depositing a metal nitride layer.

4. The method of claim 3, wherein depositing a diffusion barrier comprises depositing a tantalum nitride layer.

5. The method of claim 3, wherein depositing the second seed layer comprises depositing ruthenium by atomic layer deposition.

6. The method of claim 1, wherein depositing a diffusion barrier comprises depositing a metal carbide layer.

7. The method of claim 6, wherein depositing a diffusion barrier comprises depositing a tungsten carbide layer.

8. The method of claim 1, wherein depositing a diffusion barrier comprises depositing a metal nitride carbide layer.

9. The method of claim 8, wherein depositing a diffusion barrier comprises depositing a tungsten nitride carbide layer.

10. The method of claim 8, wherein depositing a diffusion barrier comprises depositing a molybdenum nitride carbide layer.

11. The method of claim 1, wherein oxidizing the top layer of the barrier layer comprises exposing the barrier layer to an oxygen source chemical.

12. The method of claim 11, wherein the oxygen source chemical is selected from the group comprising air, diatomic oxygen, ozone, oxygen radicals, and hydrogen peroxide.

13. The method of claim 1, further comprising repeating oxidizing and reducing the top of the barrier layer before depositing the conductor directly on the first seed layer.

14. The method of claim 13, wherein oxidizing and reducing the top of the barrier layer is repeated between about 10 and 50 times.

15. The method of claim 14, wherein oxidizing and reducing the top of the barrier layer is repeated between about 20 and 40 times.

16. The method of claim 1, wherein depositing the conductor comprises depositing a second seed layer.

17. The method of claim 16, wherein depositing the second seed layer comprises depositing ruthenium.

18. The method of claim 16, further comprising depositing copper directly over the second seed layer.

19. The method of claim 1, wherein depositing a conductor comprises depositing copper.

20. The method of claim 19, wherein depositing copper comprises an electrochemical deposition process.

21. The method of claim 19, wherein depositing copper comprises an electroless deposition process.

22. The method of claim 19, wherein depositing copper comprises a chemical vapor deposition (CVD) process.

23. The method of claim 1, wherein reducing comprises reducing the metal oxide to an elemental metal form.

24. The method of claim 1, wherein reducing the oxidation state comprises using hydrogen, hydrogen plasma, or carbon monoxide.

25. The method of claim 1, wherein reducing the oxidation state comprises using in situ hydrogen plasma.

26. The method of claim 1, wherein reducing the oxidation state comprises using remote hydrogen plasma.

27. The method of claim 1, wherein reducing the oxidation state comprises an electrochemical process.

28. The method of claim 1, wherein reducing the oxidation state of the metal oxide comprises exposing the metal oxide to a gaseous compound containing a functional from the group comprising alcohol (—OH), aldehyde (—CHO), and carboxylic acid (—COOH).

29. A method for metallizing an integrated circuit, the method comprising
   forming a diffusion barrier layer on a substrate;
   performing a preparation process on the substrate to form a nucleation layer, the preparation process comprising exposing the diffusion barrier layer to an oxidant and a reducing agent, wherein the oxidant oxidizes a portion of the diffusion barrier layer and the reducing agent reduces the oxidized portion of the diffusion barrier layer;
   depositing a conductor over the nucleation layer to form a seed layer that is different from the nucleation layer after the preparation process is complete; and
   depositing copper over the seed layer.

30. The method of claim 29, wherein depositing the conductor comprises depositing ruthenium.

31. The method of claim 29, wherein depositing the conductor comprises depositing a metal by atomic layer deposition.

32. The method of claim 29, wherein the preparation process comprises:
   exposing the substrate to a pulse of oxygen in a reactor chamber;
   purging the reactor chamber with an inert gas;
   exposing the substrate to a pulse of hydrogen; and
   purging the reactor chamber with an inert gas.

33. The method of claim 32, wherein the oxygen pulse lasts less than 60 seconds.

34. The method of claim 32, wherein the hydrogen pulse lasts less than 60 seconds.

35. The method of claim 33, wherein the oxygen pulse lasts between about 5 and 40 seconds.

36. The method of claim 34, wherein the hydrogen pulse lasts between about 5 and 40 seconds.

37. The method of claim 35, wherein the oxygen pulse lasts between about 10 and 30 seconds.

38. The method of claim 36, where the hydrogen pulse lasts about 10 and 30 seconds.

39. The method of claim 32, wherein exposing the substrate to the hydrogen pulse comprises exposing the substrate to in situ hydrogen plasma.

40. The method of claim 32, wherein exposing the substrate to the hydrogen pulse comprises exposing the substrate to remote hydrogen plasma.

41. The method of claim 29, wherein forming the diffusion barrier comprises depositing tungsten nitride carbide.

42. The method of claim 29, wherein forming the diffusion barrier comprises depositing molybdenum nitride carbide.

43. The method of claim 29, wherein depositing the copper comprises electrochemical deposition.

44. The method of claim 29, wherein depositing the copper comprises chemical vapor deposition.

45. The method of claim 29, further comprising repeating the preparation process on the substrate n times, wherein n=$\{1, 2, \ldots, 100\}$.

46. The method of claim 45, wherein n is less than or equal to 100.

47. The method of claim 46, wherein n is between about 10 and 50.

48. The method of claim 47, wherein n is between about 20 and 40.

* * * * *